(12) United States Patent
Bolognia (10) Patent No.: US 9,212,052 B2
(45) Date of Patent: Dec. 15, 2015

(54) PACKAGED MICROPHONE WITH MULTIPLE MOUNTING ORIENTATIONS

(71) Applicant: Invensense, Inc., San Jose, CA (US)

(72) Inventor: David Bolognia, North Andover, MA (US)

(73) Assignee: INVENSENSE, INC., San Jose, CA (US)

( * ) Notice: Subject to any disclaimer, the term of this patent is extended or adjusted under 35 U.S.C. 154(b) by 43 days.

(21) Appl. No.: 13/960,974

(22) Filed: Aug. 7, 2013

(65) Prior Publication Data

US 2015/0041929 A1 Feb. 12, 2015

(51) Int. Cl.
*B81B 7/00* (2006.01)
*B81C 1/00* (2006.01)
*H04R 25/00* (2006.01)

(52) U.S. Cl.
CPC .............. *B81B 7/007* (2013.01); *B81C 1/00301* (2013.01); *H04R 25/604* (2013.01); *H04R 2201/003* (2013.01)

(58) Field of Classification Search
CPC ............... H04R 2201/003; H04R 7/04; B81B 2201/0257
USPC ................. 381/355, 369, 175, 380; 310/12.03
See application file for complete search history.

(56) References Cited

U.S. PATENT DOCUMENTS

| | | | |
|---|---|---|---|
| 7,790,492 B1 * | 9/2010 | Baumhauer et al. ............. | 438/51 |
| 7,825,509 B1 * | 11/2010 | Baumhauer, Jr. et al. .... | 257/724 |
| 2005/0189635 A1 * | 9/2005 | Humpston et al. ............. | 257/678 |
| 2007/0013036 A1 * | 1/2007 | Zhe et al. ....................... | 257/659 |
| 2007/0013052 A1 * | 1/2007 | Zhe et al. ....................... | 257/704 |
| 2007/0041597 A1 * | 2/2007 | Song ............................... | 381/175 |
| 2007/0057602 A1 * | 3/2007 | Song ............................... | 310/328 |
| 2008/0094753 A1 * | 4/2008 | Brodkin et al. ............. | 360/234.5 |
| 2008/0175425 A1 | 7/2008 | Roberts | |
| 2009/0218668 A1 * | 9/2009 | Zhe et al. ....................... | 257/680 |
| 2010/0090295 A1 * | 4/2010 | Zhe et al. ....................... | 257/415 |
| 2010/0155863 A1 * | 6/2010 | Weekamp ..................... | 257/416 |
| 2010/0322443 A1 | 12/2010 | Wu | |
| 2011/0062573 A1 * | 3/2011 | Zhe et al. ....................... | 257/680 |
| 2011/0073967 A1 * | 3/2011 | Chen et al. ..................... | 257/416 |
| 2012/0250925 A1 * | 10/2012 | Lillelund ....................... | 381/355 |
| 2013/0050227 A1 * | 2/2013 | Petersen et al. ............... | 345/501 |

FOREIGN PATENT DOCUMENTS

WO WO2007123293 11/2007

OTHER PUBLICATIONS

Graf, Rudolf F., Modern Dictionary of Electronics, 1999, Newnes, Seventh Edition, "Pad" and "Substrate".*

* cited by examiner

*Primary Examiner* — Michael Lebentritt
*Assistant Examiner* — Jordan Klein
(74) *Attorney, Agent, or Firm* — Maryam Imam; IPxLaw Group LLP (57) ABSTRACT

A packaged microphone has a base and a lid that at least in part form a package having a plurality of exterior sides and an interior chamber. The packaged microphone also has a flexible substrate having a first portion within the interior chamber, and a second portion, extending from the interior chamber, having at least two sets of pads. A MEMS microphone die is mounted to the first portion of the flexible substrate, and each set of pads is in electrical communication with the microphone die. One set of pads is on a first exterior side of the package, and a second set of pads is on a second exterior side of the package.

18 Claims, 7 Drawing Sheets

PACKAGED MICROPHONE WITH MULTIPLE MOUNTING ORIENTATIONS

FIELD OF THE INVENTION

The invention generally relates to microphones and transducers and, more particularly, the invention relates to packages for microphones and transducers.

BACKGROUND OF THE INVENTION

MEMS microphones are used in a growing number of devices, such as mobile telephones, laptop computers, voice recorders, hearing instruments, and other electronic devices. To those ends, MEMS microphone dies typically are mounted within a package interior and controlled by an adjacent integrated circuit die 48. For example, a MEMS microphone package may include a substrate, such as an FR-4 based printed circuit board (PCB), a MEMS microphone die attached to the substrate, and a cup-shaped lid attached to the substrate to create a package. The interior of the package forms an interior chamber that protects the fragile MEMS microphone die from the environment.

The interior chamber is not completely isolated, however, from the external environment. Specifically, the package also has an aperture to permit communication between the microphone die and an acoustic signal generated outside of the package. For example, to permit access of an acoustic signal into the package, the substrate may form a through-hole aperture under the microphone die, above the die, or to the side of the die. The acoustic signal thus enters through the aperture, and strikes the diaphragm portion of the microphone die, causing the die to generate corresponding electrical signals.

Certain uses of packaged MEMS microphones have limited options for mounting the package to an underlying substrate, such as a printed circuit board.

SUMMARY OF VARIOUS EMBODIMENTS

In accordance with one embodiment of the invention, a packaged microphone has a base and a lid that at least in part form a package having a plurality of exterior sides (e.g., six, including top and bottom) and an interior chamber. The packaged microphone also has a flexible substrate having a first portion within the interior chamber, and a second portion, extending from the interior chamber, having at least two sets of pads. A MEMS microphone die is mounted to the first portion of the flexible substrate, and each set of pads is in electrical communication with the microphone die. One set of pads is on a first exterior side of the package, and a second set of pads is on a second exterior side of the package.

Among other orientations, the first exterior side may be substantially perpendicular to the second exterior side. Moreover, the second portion may have a third set of pads on a third exterior side of the package, and/or the first and second sets of pads may be electrically equivalent. To provide stiffness, the base preferably is more rigid than the flexible substrate.

Most or all of the second portion of the flexible substrate may be mounted generally flush against the package. In illustrative embodiments, the package has a third exterior side free of pads and forming an inlet aperture. Alternatively or in addition, the first exterior side may form an inlet aperture. Moreover, the lid and base may form an opening (between the interior chamber and the first exterior side of the package) through which the flexible substrate extends. Specifically, the flexible substrate may extend through the opening, which is closed at least in part by the flexible substrate.

In accordance with another embodiment of the invention, a packaged microphone has a base and a lid that at least in part form an interior chamber and a package having first and second exterior sides. The packaged microphone also has a MEMS microphone die mounted within the interior chamber, and first and second sets of pads electrically connected with the microphone die. The first set of pads are on the first exterior side of the package, and the second set of pads are on the second exterior side of the package. The first exterior side of the package preferably is substantially perpendicular to the second exterior side of the package.

In accordance with other embodiments of the invention, a method of forming a packaged microphone mounts a MEMS microphone die to a flexible substrate, and mounts the flexible substrate to a base. It should be noted that either of these steps can be executed before the other. The method then secures a lid to the base to form an interior chamber and a package having a plurality of exterior sides. This step consequently divides the flexible substrate into a first portion, which is within the interior chamber, and a second portion having a first set of pads and a second set of pads. The second portion with the first set of pads is secured to a first exterior side of the package, and the second portion with the second set of pads is secured to a second exterior side of the package.

In accordance with another embodiment, a packaged microphone has a base and a lid that at least in part form a package having a plurality of exterior sides and an interior chamber. The packaged microphone also has a flexible substrate having a first portion within the interior chamber, and a second portion, extending from the interior chamber, having at least one set of pads. A MEMS microphone die is mounted to the first portion of the flexible substrate, and the set of pads is in electrical communication with the microphone die and mounted on an exterior side of the package.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a packaged microphone is configured to more easily fit within a constrained space. To that end, such a packaged microphone may include electrical interface pads on two or more different exterior sides of the package. Those pads may have the same electrical pattern and thus, permit multiple different mounting orientations. Accordingly, those skilled in the art can choose the package mounting orientation based upon a number of factors, such as the size of the interior portion of the underlying device containing the packaged microphone. Details of these and other embodiments are discussed below.

Figure 1A:
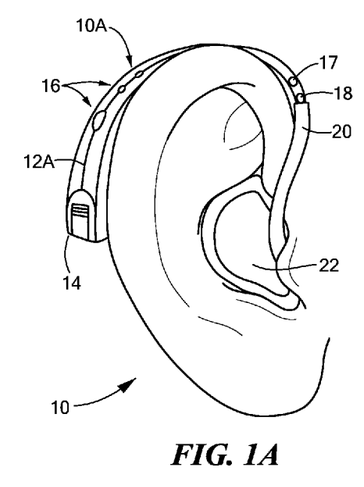
FIGS. 1A-1D schematically show a plurality of different types of hearing aids that may incorporate illustrative embodiments of the invention.
Figure 1B:
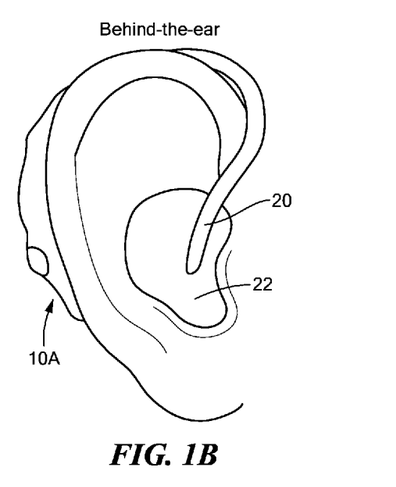
Figure 1C:
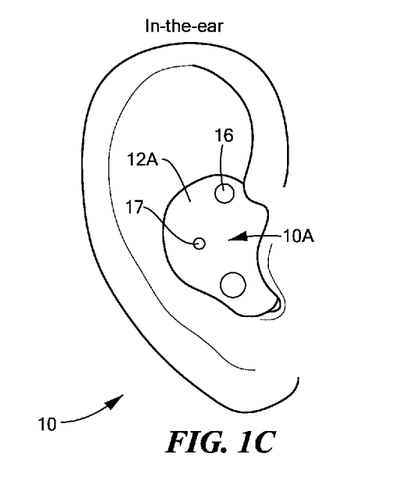
Figure 1D:
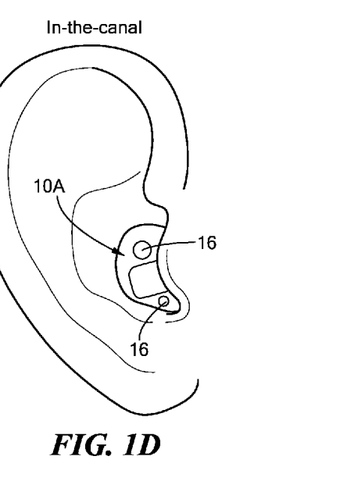

FIGS. 1A-1D illustratively show various different types of hearing aids 10A that may incorporate packaged microphones implementing illustrative embodiments of the invention. FIGS. 1A and 1B show different "behind the ear" types of hearing aids 10A that, as their name suggests, have a significant portion secured behind a person's ear during use. In contrast, FIGS. 1C and 1D show hearing aids 10A that do not have a component behind the ear. Instead, these types of hearing aids 10A mount within the ear. Specifically, FIG. 1C shows an "in-the-ear" hearing aid 10A which, as its name suggests, mounts in-the-ear, while FIG. 1D shows an "in-the-canal" hearing aid 10A which, as its name suggests, mounts more deeply in the ear—namely, in the ear canal.

With reference to FIG. 1A, the intelligence, sensors (e.g., packaged microphones 17, discussed in greater detail below), and logic of the behind the ear type of hearing aid 10A lies primarily within a housing 12A that mounts behind the ear. To that end, the housing 12A forms an interior that contains internal electronics for processing audio signals, a battery compartment 14 (a powering module) for containing a battery (not shown) that powers the hearing aid 10A, and mechanical controlling features 16, such as knobs, for controlling the internal electronics. In addition, the hearing aid 10A also includes a packaged microphone 17 for receiving audio signals, and a speaker 18 for transmitting amplified audio signals received by the packaged microphone 17 and processed by the internal electronics. A hollow tube 20 directly connected to the end of the hearing aid 10A, right near the speaker 18, channels these amplified signals into the ear. To maintain the position of this tube 20 and mitigate undesired feedback, the hearing aid 10A also may include an ear mold 22 (also part of the body of the hearing aid 10A) formed from soft, flexible silicone molded to the shape of the ear opening.

Among other things, the hearing aid 10A may have circuitry and logic for optimizing the signal generated through the speaker 18. More specifically, the hearing aid 10A may have certain program modes that optimize signal processing in different environments. For example, this logic may include filtering systems that produce the following programs:

normal conversation in a quiet environment,
normal conversation in a noisy environment,
listening to a movie in a theater, and
listening to music in a small area.

The hearing aid 10A also may be programmed for the hearing loss of a specific user/patient. It thus may be programmed to provide customized amplification at specific frequencies. Some of this functionality can be implemented within its internal packaged microphone 17.

The other two types of hearing aids typically have the same internal components, but in a smaller package. This creates further design challenges in mounting the packaged microphone 17 within the device. Specifically, the in-the-ear hearing aid 10A of FIG. 1C has a flexible housing 12A, with the noted internal components, molded to the shape of the ear opening. In particular, among other things, those components include a packaged microphone 17 facing outwardly for receiving audio signals, a speaker (not shown) facing inwardly for transmitting those signals into the ear, and internal logic for amplifying and controlling performance.

The in-the-canal hearing aid 10A of FIG. 1D typically has all the same components, but in a smaller package to fit in the ear canal. Some in-the-canal hearing aids 10A also have an extension (e.g., a wire) extending out of the ear to facilitate hearing aid removal. Because they fit in tight spots (e.g., behind the ear or in the ear canal), space for internal system components (e.g., microphones) is at a premium.

Figure 2:
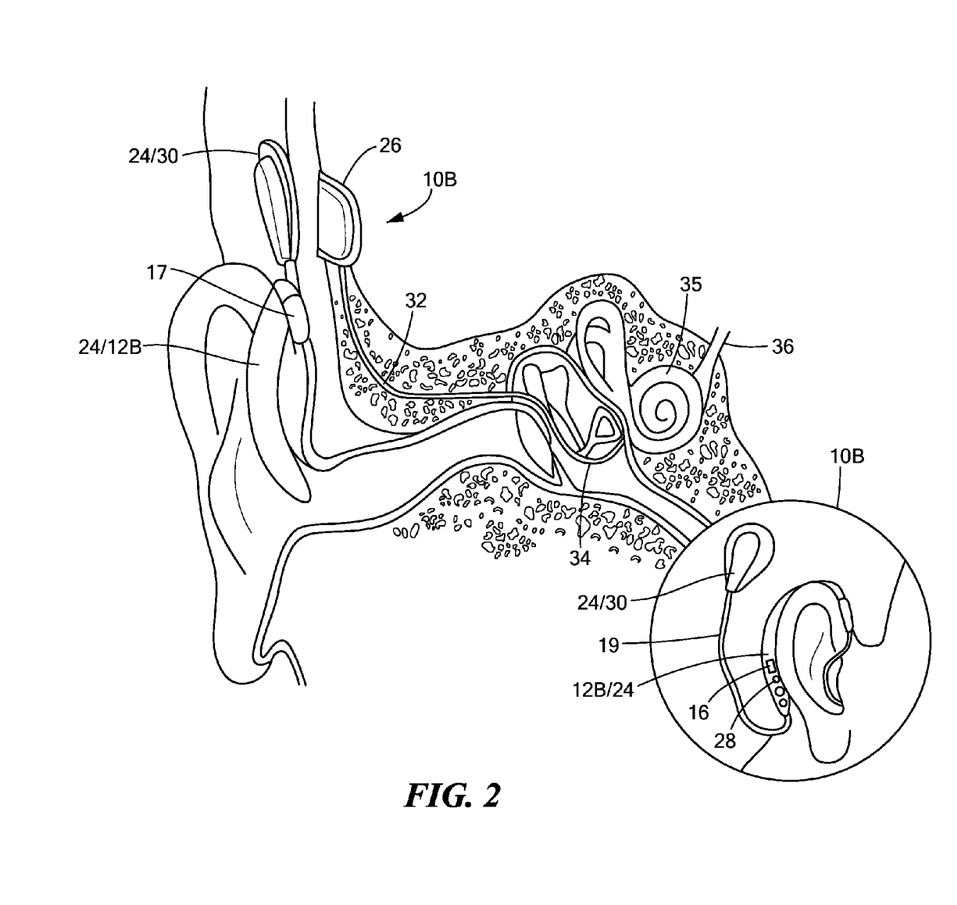
FIG. 2 schematically shows one example of a cochlear implant that may incorporate illustrative embodiments of the invention.

FIG. 2 schematically shows another type of hearing instrument, a cochlear implant 10B, which, in a similar manner, also has significant space constraints for its internal components. At a high level, a cochlear implant 10B has the same function as that of a hearing aid 10A; namely, to help a person hear normally audible sounds. A cochlear implant 10B, however, performs its function in a different manner by having an external portion 24 that receives and processes signals, and an implanted portion 26 physically located within a person's head.

To those ends, the external portion 24 of the cochlear implant 10B has a behind the ear portion with many of the same components as those in a hearing aid 10A behind the ear portion. The larger drawing in FIG. 2 shows this behind the ear portion as a transparent member since the ear covers it, while the smaller drawing of that same figure shows it behind the ear.

Specifically, the behind the ear portion includes a housing/body 12B that contains a packaged microphone 17 for receiving audio signals, internal electronics for processing the received audio signals, a battery, and mechanical controlling features 16 (e.g., knobs) for controlling the internal electronics. Those skilled in the art often refer to this portion as the "sound processor" or "speech processor." A wire 19 extending from the sound processor connects with a transmitter 30 magnetically held to the exterior of a person's head. The speech processor communicates with the transmitter 30 via the wire 19.

The transmitter 30 includes a body having a magnet that interacts with the noted implanted metal portion 26 to secure it to the head, wireless transmission electronics to communicate with the implanted portion 26, and a coil to power the implanted portion 26 (discussed below). Accordingly, the packaged microphone 17 in the sound processor receives audio signals, and transmits them in electronic form to the transmitter 30 through the wire 19, which subsequently wirelessly transmits those signals to the implanted portion 26.

The implanted portion 26 thus has a receiver with a microprocessor to receive compressed data from the external transmitter 30, a magnet having an opposite polarity to that in the transmitter 30 both to hold the transmitter 30 to the person's head and align the coils within the external portion 24/transmitter 30, and a coil that cooperates with the coil in the exterior transmitter 30. The coil in the implanted portion 26 forms a transformer with the coil of the external transmitter 30 to power its own electronics. A bundle of wires 32 extending from the implanted portion 26 passes into the ear canal and terminates at an electrode array 34 mounted within the cochlea 35. As known by those skilled in the art, the receiver transmits signals to the electrode array 34 to directly stimulate the auditory nerve 36, thus enabling the person to hear sounds in the audible range of human hearing.

Various embodiments also may apply to other types of hearing instruments, such as receiver-in-canal hearing instruments, which have the speaker outside of the main body. Indeed, illustrative embodiments of the invention may implement packaged microphones 17 in a variety of other underlying devices. For example, among other things, the packaged microphones 17 discussed herein may be implemented in mobile telephones, smartphones, cameras, computers, gaming systems, and hand-held public announcement ("PA") devices. Accordingly, discussion of hearing instruments or some other higher level system is for exemplary purposes only and not intended to limit all embodiments of the invention.

Figure 3:
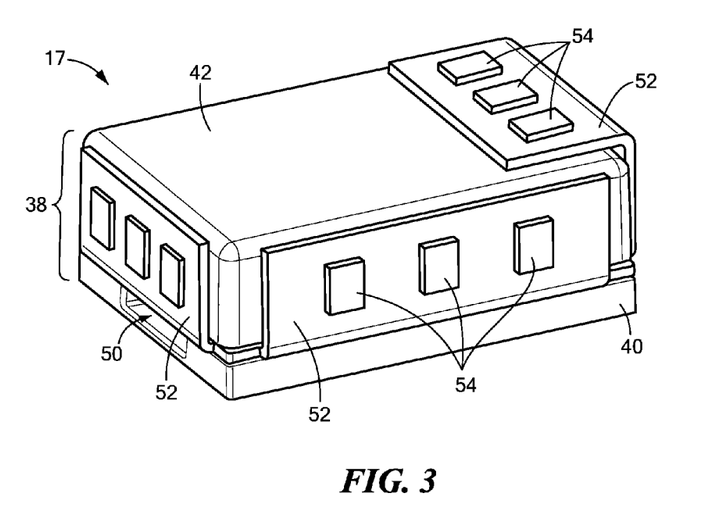
FIG. 3 schematically shows a prospective view of a packaged microphone configured in accordance with illustrative embodiments of the invention.
Figure 4:
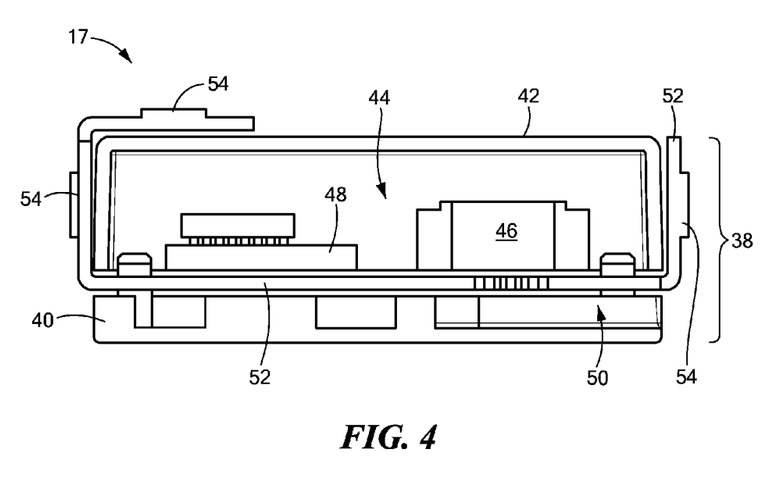
FIG. 4 schematically shows a cross-sectional view of the packaged microphone of FIG. 3.

FIG. 3 schematically shows a perspective view of a packaged microphone 17 configured in accordance with illustrative embodiments of the invention. To view the interior portions, FIG. 4 schematically shows a cross-sectional view of the same packaged microphone 17. As shown, the packaged microphone 17 has a package 38 that may be coupled with an underlying apparatus, such as a printed circuit board. The underlying apparatus, however, can comprise any of a variety of other devices. Accordingly, discussion of a printed circuit board is illustrative and not intended to limit a variety of other embodiments.

The package 38 has a base 40 that, together with a corresponding lid 42, forms an interior chamber 44 containing a MEMS/silicon microphone die 46 and circuit die 48 (discussed below with regard to FIGS. 5A and 5B). The primary function of the circuit die 48 is to control and manage input to, and output from, the microphone die 46. For example, among other things, a circuit die 48 may amplify varying capacitance signals produced by the microphone die 46, and control the voltage applied to the microphone die 46. In illustrative embodiments, the circuit die 48 is implemented as an application specific integrated circuit, which is also known as an "ASIC."

The package 38 forms at least one inlet aperture 50 that permits an acoustic signal to enter the interior chamber 44 and contact the microphone die 46. The aperture 50 may be at any convenient location on the package 38. For example, when used for consumer application, such as in a smartphone, the inlet aperture 50 may extend through the bottom surface of the package 38. Alternatively, when used for a hearing instrument, such as the hearing aid 10A of FIG. 1A, the inlet aperture 50 may extend through one of the side surfaces of the package 38. Accordingly, those skilled in the art can select the appropriate location for the inlet aperture 50.

Illustrative embodiments to not directly mount the microphone die 46 and circuit die 48 to the interior surface of the base 40. Instead, those components (and other electronic components) are mounted to a flexible substrate 52, which is directly secured to the interior surface of the base 40. Accordingly, the flexible substrate 52 provides the necessary interconnects between the internal components, such as the dies 46 and 48. To that end, the flexible substrate 52 may be formed from any of a number of flexible interconnect apparatuses. For example, flexible substrate 52 may be formed primarily from a flexible circuit or a flexible printed circuit board. In any case, the flexible substrate 52 preferably is less rigid than the base 40.

In illustrative embodiments, the package base 40 may be formed from an electrical interconnect apparatus, such as a ceramic package material, carrier, printed circuit board material (e.g., using alternating layers of FR-4 or a BT-resin/epoxy laminate-type material). Other types of packages may be used, however, such as premolded, leadframe-type packages (also referred to as a "premolded package"). The base 40 may be a cavity package, or a flat-type package.

Because microphones can be susceptible to radio frequency interference, or electromagnetic interference (EMI), the package 38 preferably incorporates noise reducing technology. Accordingly, illustrative embodiments effectively form a Faraday cage around the microphone in any of a number of different manners. To that end, the lid 42 in the embodiments shown is a cavity-type, solid metal lid, which has four walls extending generally orthogonally from a top, interior face to form a cavity. As solid metal, the lid 42 does not require a metal coating on a plastic or other base material. Instead, illustrative embodiments form the lid 42 from a piece of metal, such as a piece of sheet metal. For example, in illustrative embodiments, the lid 42 is a formed metal lid having a generally cup-shaped concavity defining a part of the interior chamber 44. The lid 42 secures to the top face of the substantially flat package base 40 to form the interior chamber 44.

Other types of metal lids may be used. For example, the lid 42 may be flat and coupled to upwardly projecting walls extending from the base 40. Alternatively, the lid 42 may be formed from a non-conductive material, with or without a conductive layer, such as metal.

Conventional techniques connect the lid 42 to the base 40. For example, after mounting the flexible substrate 52 to the base 40, conventional fabrication processes (also discussed below with regard to FIG. 8) can connect the lid 42 to the base 40 with an adhesive. As known by those skilled in the art, a difference in the potential between the lid 42 and base 40 undesirably can interfere with movement of the diaphragm 60. Accordingly, the package 38 preferably has a conductive adhesive to connect the lid 42 and base 40 to ensure that the lid 42 has the same potential as prescribed portions of the base 40. To that end, the base 40 may have a bond pad that directly contacts the lid 42 to provide this like potential.

As noted above, acoustic signals enter the interior chamber 44 through one or more apertures 50 through the package 38. Those signals interact with the microphone die 46 and, consequently, the circuit die 48, to produce an electrical signal. External contacts/bond pads 54 for electrically (and physically, in many anticipated uses) connecting the microphone system 10 with an external apparatus (not shown but noted above), such as a printed circuit board or other electrical interconnect apparatus. Accordingly, during use, the microphone die 46 and circuit die 48 cooperate to convert audio/acoustic signals (i.e., sound) received through the aperture 50 into electrical signals, and route those signals through external contacts/bond pads 54 discussed above and below to the underlying apparatus (e.g., a circuit board).

Illustrative embodiments, however, do not limit the bond pads 54 to a single surface of the package 38. Instead, as best shown in FIG. 3, the bond pads 54 may be on two or more orthogonally positioned exterior package surfaces. To that end, the flexible substrate 52 preferably is sized and configured to extend from the interior chamber 44 of the package 38 to the exterior of the package 38. The substrate portion on the outside of the package 38, referred to as the "exterior portion" of the flexible substrate 52, has one or more sets of pads 54 for mounting onto the noted underlying apparatus.

More specifically, FIG. 4 shows the flexible substrate 52 effectively forming four separate sets of pads 54 on four respective exterior walls of the package 38. In this case, each set of pads 54 includes three pads 54, although the number of pads 54 depends upon the requirements of application. For example, each set of pads 54 may include one pad, two pads 54, four pads 54, or more, depending on space and electrical limitations. To improve mounting flexibility, each set of pads 54 may be electrically identical. For example, in each set, the left pad 54 may connect to the microphone die 46, the middle pad 54 may connect to the circuit die 48, and the right pad 54 may provide a ground reference to the package 38. In other embodiments, however, the pads 54 are not electrically identical/equivalent, thus providing a different type of mounting flexibility. In yet other embodiments, a first pair of pad sets are identical, while another pair of pad sets are identical, but different from the first pair of pad sets.

In addition to the pads 54 formed by the flexible substrate 52, alternative embodiments also may include standard pads 54 (not shown) extending through the package 38. For example, the bottom surface of the package 38 may include a plurality of pads 54 that are integral with the base 40; namely, they are not formed from the flexible substrate 52. Instead, these pads 54 may be formed from vias forming conductive pathways through the base 40.

Since it covers at least part of the package 38, the exterior portion of the flexible substrate 52 may form a portion of the inlet aperture 50. In that case, the inlet aperture 50 may extend through both the package 38 and the external portion of the flexible substrate 52. In other embodiments, however, the inlet aperture 50 may extend through the lid 42 and/or base 40 only.

It is important to ensure that the interior chamber 44 has no openings other than the inlet aperture(s) 50. Undesired openings can significantly degrade performance. Extending the flexible substrate 52 to the exterior from the interior chamber 44, however, can produce some potential openings. As discussed below, illustrative embodiments may specially configure the lid 42, base 40, or both the lid 42 and the base 40, to prevent this undesired result. For example, the lid 42 may have one or more undercuts at the locations where the flexible substrate 52 directly contacts both the lid 42 and the base 40—i.e., where it exits the interior chamber 44. To further ensure the integrity of the interior chamber 44, some embodiments also may apply sealant around the seam formed between the base 40 and lid 42. Accordingly, the flexible substrate 52 alone (with adhesive) may close a portion of the space between the lid 42 and the base 40, or both the flexible substrate 52 and sealant may close that noted space.

The external portions of the flexible substrate 52 having the pads 54 preferably are mounted substantially flush against the respective exterior faces of the package 38. A suitable adhesive or other material should provide the structural integrity to ensure that the flexible substrate 52 does not delaminate or separate from the exterior package surface during use.

Some implementations may include multiple flexible substrates 52 to perform the effective function of the single flexible substrate 52 shown in FIGS. 3 and 4. For example, the microphone die 46 may be mounted on a first flexible substrate 52, while the circuit die 48 may be mounted on a second, separate flexible substrate 52. One or more of those to flexible substrates 52 may have exterior portions with pads 54 extending from the interior as shown in FIG. 3. Accordingly, illustrative embodiments are not limited to a single flexible substrate 52.

The microphone die 46 may be implemented as any of a number of different types of microphone dies. For example, as suggested above, the microphone die 46 may be implemented as a MEMS microphone die. To that end, FIG. 5A schematically shows a top, perspective view of a MEMS microphone die 46 that may be used with illustrative embodiments of the invention. FIG. 5B schematically shows a cross-sectional view of the same MEMS microphone die 46 across line B-B of FIG. 5A. These two figures are discussed simply to detail some exemplary components that may make up a microphone die 46 that may be used in accordance with various embodiments.

Figure 5A:
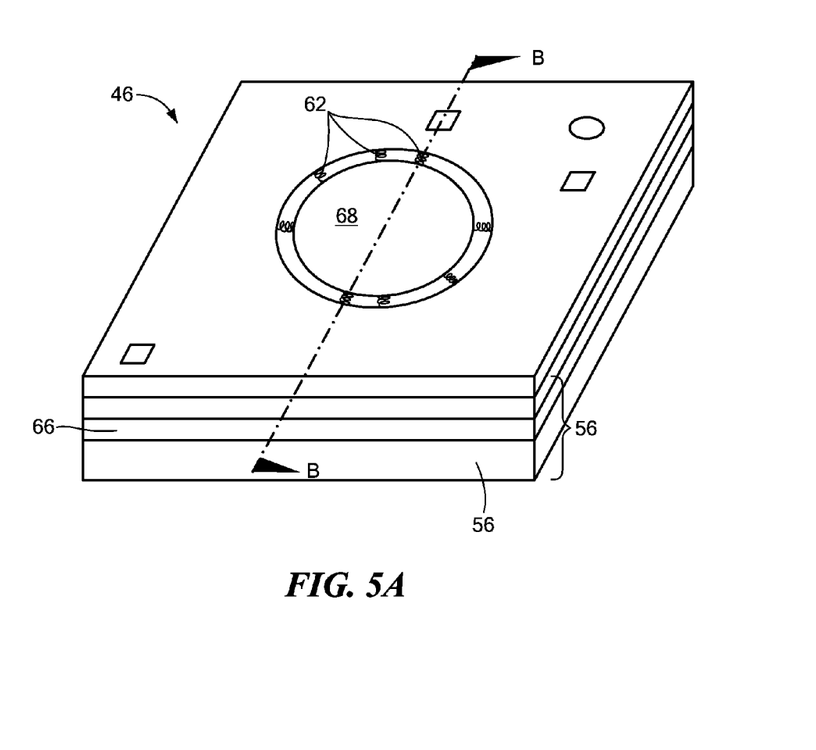
FIG. 5A schematically shows a perspective view of a MEMS microphone that may be used with illustrative embodiments of the invention.
Figure 5B:
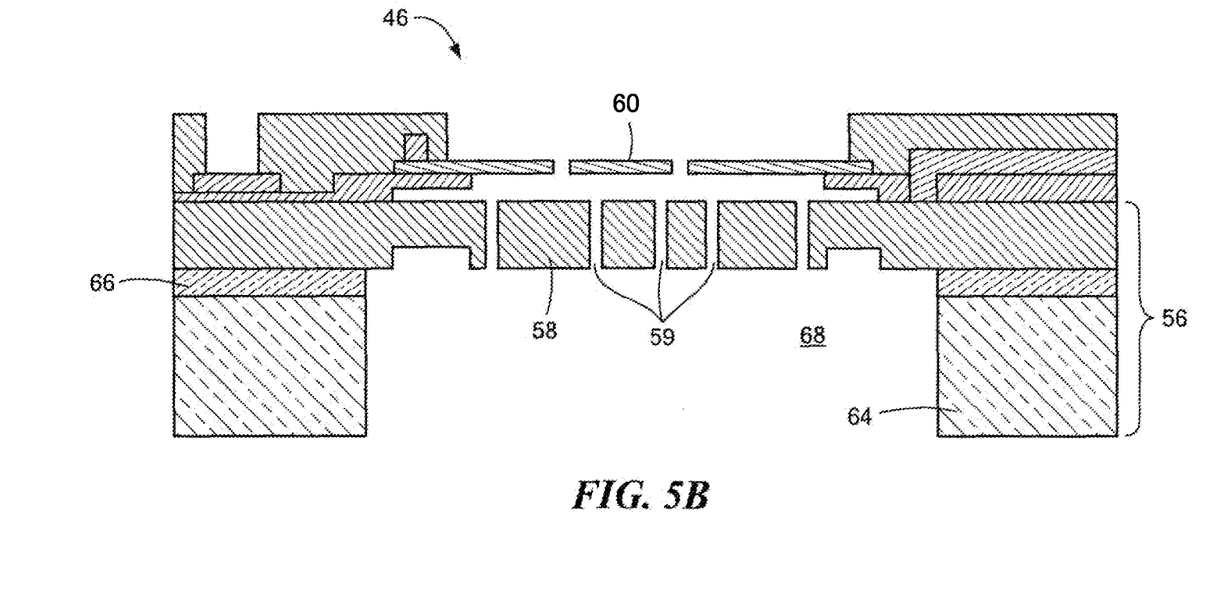
FIG. 5B schematically shows a cross-sectional view of the MEMS microphone of FIG. 5A across line B-B.

As shown in FIGS. 5A and 5B, the microphone die 46 has a chip base 56, one portion of which supports a backplate 58. The microphone die 46 also includes a flexible diaphragm 60 that is suspended by springs 62 over, and movable relative to, the backplate 58. The backplate 58 and diaphragm 60 together form a variable capacitor. In illustrative embodiments, the backplate 58 is formed from single crystal silicon (e.g., a part of a silicon-on-insulator wafer), while the diaphragm 60 is formed from deposited polysilicon. In other embodiments, however, the backplate 58 and diaphragm 60 may be formed from different materials.

In the embodiment shown in FIGS. 5A and 5B, the chip base 56 includes the backplate 58 and other structures, such as a bottom wafer 64 and a buried oxide layer 66 of a silicon-on-insulator (i.e., a SOI) wafer. A portion of the chip base 56 also forms a backside cavity 68 extending from the bottom of the chip base 56 to the bottom of the backplate 58. To facilitate operation, the backplate 58 has a plurality of through-holes 59 that lead to the backside cavity 68.

In operation, as generally noted above, audio/acoustic signals strike the diaphragm 60 of the microphone die 46 at substantially the same time, causing them to vibrate, thus varying the distance between the diaphragm 60 and the backplate 58 to produce a changing capacitance. Such audio signals may contact the microphone die 46 from any direction. For example, the acoustic signals may travel upward, first through the backplate 58, and then partially through and against the diaphragm 60. As another example, the microphone die 46 may be oriented so that the acoustic signals may travel in the opposite direction.

It should be noted that discussion of a specific microphone die 46 is for illustrative purposes only. Other microphone configurations thus may be used with illustrative embodiments of the invention. For example, rather than using an SOI wafer, the microphone die 46 may be formed from a bulk silicon wafer substrate, and/or the backplate 58 may be formed from a deposited material, such as deposited polysilicon.

Figure 6:
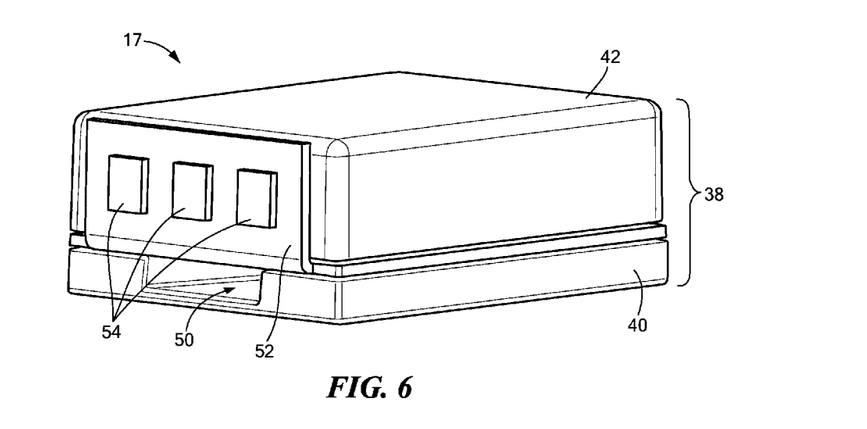
FIG. 6 schematically shows a perspective view of a packaged microphone in which a flexible substrate forms external interfaces on one side of the package.

Although FIG. 3 shows the flexible substrate 52 as forming pads 54 on four different package surfaces, those skilled in the art can position pads 54 on more or fewer package surfaces. For example, FIG. 6 schematically shows an embodiment in which the flexible substrate 52 forms pads 54 on just one surface. In that case, the package 38 may have pads 54 just on that one surface. Alternatively, the package 38 of FIG. 6 may have additional pads 54 on another surface. Those additional pads 54, however, are not necessarily formed by the same flexible substrate 52, or any flexible substrate 52. For example, those additional pads 54 may be formed directly as part of the base 40 or lid 42.

Figure 7:
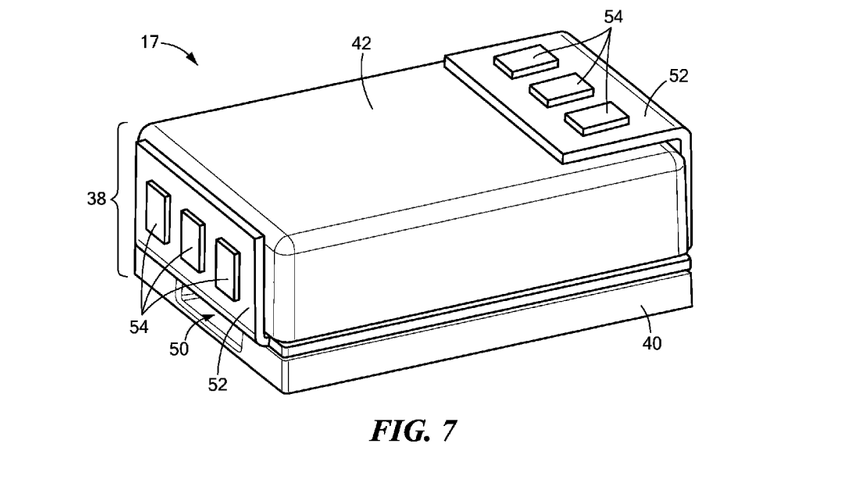
FIG. 7 schematically shows a perspective view of a packaged microphone in which a flexible substrate forms external interfaces on two or three sides of the package.

In a similar manner, FIG. 7 shows an embodiment in which the flexible substrate 52 forms one or more pads 54 on two or three surfaces of the package 38. Specifically, in the two surface embodiment, the pads 54 may be positioned on any two of the three package surfaces having the flexible substrate 52. In the three surface embodiment, all of the outer surfaces of the flexible substrate 52 have one or more pads 54. Although not shown, some embodiments can form pads 54 on all surfaces of the package 38, or five surfaces of the package 38. Indeed, some package surfaces can be free of pads 54.

Moreover, although pads 54 are shown on specific surfaces, those skilled in the art can form pads 54 on any of the surfaces not shown as having pads 54. For example, rather than forming the pads 54 on the surface shown, the single surface embodiment shown in FIG. 6 can form the pads 54 on any one of the other side surfaces, or on the top or bottom surfaces, while remaining a single surface embodiment.

Illustrative embodiments also apply to packages having other shapes, such as nonrectangular or rounded shapes. For example, the package 38 can have a cylindrical or bullet shape with the flexible substrate 52 forming pads 54 on one, two, or all surfaces.

Figure 8:
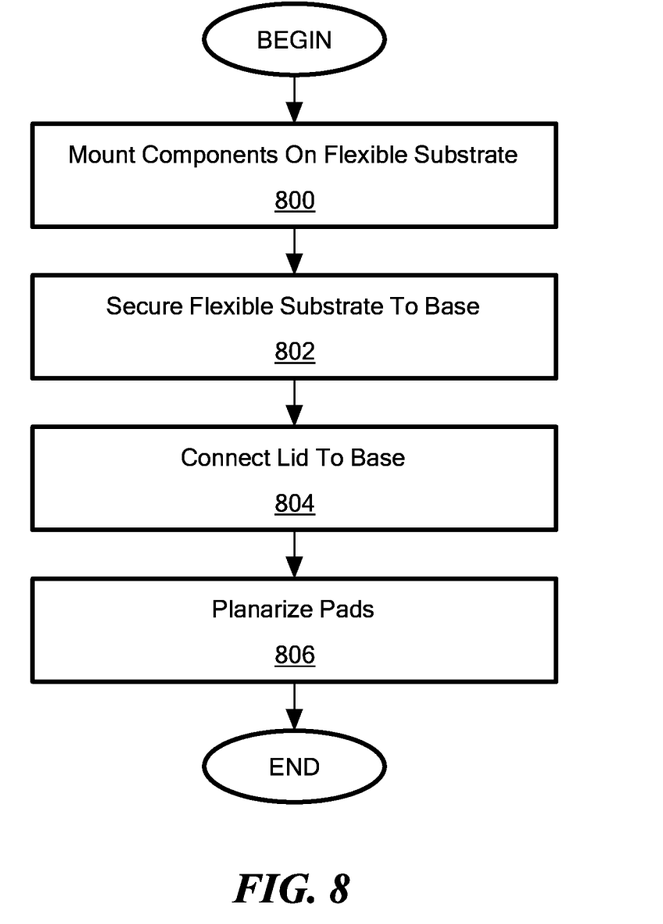
FIG. 8 shows a process of forming a packaged microphone in accordance with illustrative embodiments of the invention.

FIG. 8 shows a process of forming the packaged microphone 17 of FIGS. 3 and 4 in accordance with illustrative embodiments of the invention. It should be noted that this process is a simplified version of an actual packaging process that can have many more steps. For example, this process may have a testing step, or additional steps for performing one of the noted steps. In addition, many of the steps of the process can be performed in a different order than that disclosed. For example, steps 800 and 802 can be performed in the opposite order. In fact, some steps can be performed at substantially the same time. Accordingly, this process is but one of many different illustrative processes that may implement various embodiments the invention.

The process begins at step 800, which mechanically and electrically connects the components onto the flexible substrate 52. To that end, after applying an adhesive to their bottom surfaces, conventional pick and place packaging processes position the microphone die 46 and circuit die 48 at their appropriate locations on the flexible substrate 52. Each component then is electrically connected to the substrate 52 by conventional techniques, such as by connecting wirebonds between pads on the dies 46 and 48 and pads on the flexible substrate 52. These substrate pads are ultimately to be positioned within the interior chamber 44 of the packaged microphone 17. This step also or alternatively may directly connect the dies 46 and 48 through a direct wirebond connection.

Illustrative embodiments perform this step in a batch process on a large flexible substrate 52 having a plurality of individual flexible substrates 52 with the desired pad layout. The process them may cut the large flexible substrate 52 to produce individual flexible substrates 52 for each package 38.

Next, the process secures the individual flexible substrate 52 to the base 40 (step 802). As shown, this also may involve applying a conventional adhesive to all or part of the bottom side of the flexible substrate 52, the top surface of the base 40, or both. Alternatively, prior step 800 may not cut the large flexible substrate 52. In that case, the large flexible substrate 52 may receive adhesive and be laid out across multiple bases 40. After the large substrate 52 is secured to the bases 40, the process may cut the large flexible substrate 52 to form individual bases 40 that each have an individual flexible substrate 52. It should be reiterated that in some embodiments, the process secures the flexible substrate 52 to the base 40 before positioning the microphone or circuit dies 46 and 48 to the flexible substrate 52.

After the flexible substrate 52 is secured to the base 40, the process continues to step 804, which connects the lid 42 to the base 40. As noted above, to maintain a substantially constant potential between the lid 42 and the base 40, illustrative embodiments use a conductive adhesive to make this connection. Alternative embodiments, however, may use an insulative adhesive or other securing mechanism.

At this point in the process, the exterior portion of the flexible substrate 52 extends beyond the base 40. Of course, this portion as the interface pads 54 that ultimately will be secured to the exterior surface of the package 38. Part of this exterior portion of the flexible substrate 52, however, is positioned between one or more portions of the base 40 and the lid 42. If not considered in the design process, the thickness of the flexible substrate 52 undesirably can create one or more openings to the interior chamber 44. Accordingly, as noted above, illustrative embodiments may specially shape the base 40, lid 42, or both the base 40 and the lid 42 to have a notch or other feature through which the noted portion of the flexible substrate 52 extends.

In alternative embodiments, however, the flexible substrate 52 may cover substantially the entire top surface of the base 40. In that case, the lid 42 connects directly with the top service of the flexible substrate 52, but does not directly contact the base 40. Moreover, in that embodiment, the flexible substrate 52 preferably has a pad that electrically connects the lid 42 and the base 40 to provide a constant potential or zero potential difference between those two elements.

Various embodiments may take additional steps to form a sealed connection between those elements at the seam between the lid 42 and base 40. For example, this step may apply a further adhesive or sealant around the package 38 at that seam.

The process concludes at step 806, which planarizes the pads 54 on the outer surface of the package 38—either on one or both the lid 42 and base 40. To that end, the process may apply an adhesive to be exterior portion of the flexible substrate 52, and press that portion against the appropriate surface. Some embodiments already have the adhesive from step 802. At the conclusion of step 806, the exterior portion of the flexible substrate 52 should be generally flush against the exterior surface of the package 38 (i.e., either against a surface of the lid 42 and/or the base 40).

Various embodiments therefore permit the device designer more flexibility in positioning the packaged microphone 17 within smaller interior volumes. In addition, this design permits use of a single packaged microphone 17 in a wide variety of different applications, where each different application has specialized spacing and/or electrical interface requirements.

Although the above discussion discloses various exemplary embodiments of the invention, it should be apparent that those skilled in the art can make various modifications that will achieve some of the advantages of the invention without departing from the true scope of the invention.

What is claimed is:

1. A packaged microphone comprising:
    a base and a lid that at least in part form a package having an interior chamber and a plurality of exterior sides;
    a flexible substrate having a first portion within the interior chamber and a second portion extending from the interior chamber; and
    a MEMS microphone die mounted to the first portion of the flexible substrate,
    the second portion of the flexible substrate having at least two sets of pads, each set of pads being in electrical communication with the microphone die, one set of pads being on a first exterior side of the package, the first exterior side being substantially perpendicular to a second exterior side, and a second set of pads being on the second exterior side of the package.

2. The packaged microphone as defined by claim 1 wherein the second portion has a third set of pads being on a third exterior side of the package.

3. The packaged microphone as defined by claim 1 wherein the first and second sets of pads are electrically equivalent.

4. The packaged microphone as defined by claim 1 wherein the base is more rigid than the flexible substrate.

5. The packaged microphone as defined by claim 1 wherein most of the second portion of the flexible substrate is mounted generally flush against the package.

6. The packaged microphone as defined by claim 1 wherein the package has a third exterior side, the package also forming an inlet aperture through the third exterior side, the third exterior side being free of pads.

7. The packaged microphone as defined by claim 1 wherein the package forms an inlet aperture through the first exterior side.

8. The packaged microphone as defined by claim 1 wherein the lid and base form an opening, the flexible substrate extending through the opening between the interior chamber and the first exterior side of the package, the opening being closed at least in part by the flexible substrate.

9. A packaged microphone comprising:
   a base and a lid that at least in part form a package having an interior chamber and first and second exterior sides;
   a MEMS microphone die mounted within the interior chamber on a flexible substrate; and
   first and second sets of pads electrically connected with the microphone die,
   the first set of pads being on the first exterior side of the package,
   the second set of pads being on the second exterior side of the package,
   the first exterior side of the package being substantially perpendicular to the second exterior side of the package.

10. The packaged microphone as defined by claim 9 wherein the flexible substrate has a first portion within the interior chamber and a second portion secured to the first and second exterior sides of the package, the first set of pads and the second set of pads being on the flexible substrate.

11. The packaged microphone as defined by claim 10 wherein the microphone die is mounted to the flexible substrate and the flexible substrate is at least in part mounted on the base.

12. The packaged microphone as defined by claim 9 wherein the package has a third exterior side having a third set of pads, the third exterior side being substantially perpendicular to the first exterior side.

13. The packaged microphone as defined by claim 9 wherein the first and second sets of pads are electrically equivalent.

14. The packaged microphone as defined by claim 9 wherein the package forms an aperture for receiving sound, the aperture being formed on the first exterior side.

15. A method of forming a packaged microphone, the method comprising:
   mounting a MEMS microphone die to a flexible substrate;
   mounting the flexible substrate to a base;
   securing a lid to the base to form a package having an interior chamber and a plurality of exterior sides, securing dividing the flexible substrate into a first portion within the interior chamber and a second portion having a first set of pads and a second set of pads;
   securing the second portion with the first set of pads to a first exterior side of the package; and
   securing the second portion with the second set of pads to a second exterior side of the package,
   wherein the first exterior side is substantially perpendicular to the second exterior side.

16. The method as defined by claim 15 wherein securing the second portion with the first pads comprises securing the second portion with the first set of pads to be substantially flush with the first exterior side.

17. The method as defined by claim 15 wherein the lid and base form an opening, the flexible substrate extending through the opening between the interior chamber and the first exterior side of the package, the opening being closed at least in part by the flexible substrate.

18. The method as defined by claim 15 wherein the flexible substrate is mounted to the base before the microphone die is mounted to the flexible substrate.

* * * * *